(12) United States Patent
Kamakura

(10) Patent No.: US 7,038,243 B1
(45) Date of Patent: May 2, 2006

(54) SEMICONDUCTOR LIGHT EMITTING DEVICE

(75) Inventor: Takanobu Kamakura, Yokosuka (JP)

(73) Assignee: Kabushiki Kaisha Toshiiba, Kawasaki (JP)

( * ) Notice: Subject to any disclaimer, the term of this patent is extended or adjusted under 35 U.S.C. 154(b) by 0 days.

(21) Appl. No.: 08/578,980

(22) Filed: Dec. 27, 1995

(30) Foreign Application Priority Data

Dec. 27, 1994 (JP) .................................. 6-325713

(51) Int. Cl.
*H01L 29/22* (2006.01)
(52) U.S. Cl. ........................... 257/94; 257/79; 257/80; 257/81
(58) Field of Classification Search ................. 257/94, 257/190, 13, 40, 79
See application file for complete search history.

(56) References Cited

U.S. PATENT DOCUMENTS 4,984,242 A * 1/1991 Scifres et al. ................. 372/45
5,019,874 A * 5/1991 Inoue et al. ................... 357/16
5,153,889 A * 10/1992 Sugawara et al. ............ 372/45

\* cited by examiner

*Primary Examiner*—Hoai Pham
*Assistant Examiner*—Nathan W. Ha
(74) *Attorney, Agent, or Firm*—Oblon, Spivak, McClelland, Maier & Neustadt, P.C.

(57) ABSTRACT

A semiconductor light emitting device includes a hetero-configuration having an active layer, a first clad layer, and a second clad layer, the active layer being interposed between the clad layers. The active layer emits light when charge carriers are injected. The first and second clad layers keep the injected charge carriers in the active layer. The hetero-configuration is interposed between a first and a second electrode. The semiconductor light emitting device further includes a dense defect-injected layer. This layer is provided between the first electrode and the hetero-configuration. The dense defect layer is made of a material having a concentration of crystal defects, a value of a lattice constant and a thickness which together help prevent at least some remotely generated crystal defects from reaching the layers of the hetero-configuration.

10 Claims, 4 Drawing Sheets

SEMICONDUCTOR LIGHT EMITTING DEVICE

BACKGROUND OF THE INVENTION

The present invention relates to a semiconductor light emitting device. Particularly, this invention relates to a semiconductor light emitting device with less crystal defects and higher performance.

FIG. 1 shows a conventional semiconductor light emitting device at its cross section. This semiconductor light emitting device consists of: a semiconductor substrate 11 of n-type gallium arsenide (GaAs); a transparent buffer layer 12 of n-type GaAs; a reflective layer 13 consisting of laminated two layers of indium aluminum phosphate (InAlP) GaAs (InAlP on GaAs); a lower clad layer 14 of n-type InGaAlP; an active layer 15 of undoped InGaAlP; an upper clad layer 16 of p-type InGaAlP; a transparent current diffusing layer 17 of p-type AlGaAs; a contact layer 18 of p-type GaAs; an upper electrode 19 and a lower electrode 20.

The buffer layer 12 prevents faults from being produced due to contamination of the surface of the semiconductor substrate 11 and also prevents the active layer 15 from being infected with the defects.

The reflective layer 13 reflects light emitted by the active layer 15 so that the emitted light does not enter the buffer layer 12 and the semiconductor substrate 11 made of light absorbent material. For this reason, the reflective layer 13 consists of semiconductor layers of InAlP and GaAs laminated with each other in a predetermined thickness. The layers of InAlP and GaAs have different refractive indices to the emitted light. The lower and upper clad layers 14 and 16 keep charge carriers injected into the active layer 15 to achieve high luminous efficiency.

The active-layer 15 consists of $In_{1-y} (Ga_{1-x} Al_x) P_y$. The components "x" and "y" and the layer construction determine energy gap. The active layer 15 emits light of wavelength corresponding to the energy gap when the injected carriers recombine with each other.

The current diffusing layer 17 diffuses current thereacross to take out the emitted light through whole region of the layer 17 not only directly below the upper electrode 19.

The current diffusing layer 17 is made of transparent material (p-type AlGaAs) that has a small absorbing coefficient to the emitted light wavelength.

The contact layer 18 makes better ohmic contact between the current diffusing layer 17 and the upper electrode 19.

The upper electrode 19 is a p-type electrode of Au layer which contains zinc. Through the upper electrode 19, a current is injected into a chip of the semiconductor light emitting device. The upper electrode 19 spreads the current over entire region of the semiconductor chip. Further, the upper electrode 19 is formed so as not to scatter the emitted light. The upper electrode 19 also acts as a bonding pad.

The lower electrode 20 is an n-type electrode of Au formed as a layer which contains germanium. The lower electrode 20 drains the current.

Another conventional semiconductor light emitting device is disclosed by Japanese Patent Laid-Open NO. 4 (1992)-212479. The conventional device is a light emitting diode with double hetero-configuration. In this device, an InGaAlP active layer is interposed between two clad layers.

Such a device with the InGaAlP active layer has required advanced epitaxy aiming at epitaxial growth with better crystallization, or fewer crystal defects. This epitaxial growth achieves higher device reliability. Further, such a light emitting device is fabricated with a molding material of low resin stress. The low-resin stress material reduces any decrease in luminescence after the light emitting device is driven.

However, it is very hard to keep crystal defects to a minimum in all layers grown by epitaxy. Device selection for quality in accordance with the number of crystal defects in all epitaxy-grown layers lowers device production yields. Further, low- and high-temperature degradation tests, after packaging the devices with molding resin, tend to produce much degradation in the resin packaged devices.

SUMMARY OF THE INVENTION

A purpose of the present invention is to provide a semiconductor light emitting device with high reliability and production yields.

The present invention provides a semiconductor light emitting device including: a hetero-configuration having an active layer that emits light when charge carriers are injected, a first clad layer, and a second clad layer, the active layer being interposed between the clad layers, the first and second clad layers keeping the injected charge carriers in the active layer; a first and a second electrode, the hetero-configuration being interposed between the electrodes; and a first dense defect layer, provided between the first electrode and the hetero-configuration, the first dense defect layer made of material being more able to absorb crystal defects and prevent defect extension and migration than the hetero-configuration, the first dense defect layer preventing defects from extending or migrating into the hetero-configuration.

The device may further include a second dense defect layer, provided between the second electrode and the hetero-configuration. The second dense defect layer is made of material more able to absorb crystal defects and prevent defect extension and migration than the hetero-configuration. The second dense defect layer prevents defects injected into the hetero-configuration.

The hetero-configuration may be a double hetero-configuration in which the active layer is undoped, and the first and second clad layers are doped for a specific conductivity type.

The device may further include a current diffusion layer, provided between the first electrode and the first dense defect layer. The current diffusion layer diffuses current applied through the first electrode.

The device may further include a semiconductor substrate provided between the second electrode and the hetero-configuration and a buffer layer provided on the semiconductor substrate. The buffer layer prevents defects from being generated in the semiconductor substrate and the expansion of defects into the active layer.

The present invention further provides a semiconductor light emitting device including: a hetero-configuration having an active layer that emits light when charge carriers are injected, a first clad layer, and a second clad layer, the active layer being interposed between the clad layers, the first and second clad layers keeping the injected charge carriers in the active layer; a first and a second electrode, the hetero-configuration being interposed between the electrodes; and a dense defect layer, provided between the first electrode and the hetero-configuration, the dense defect layer being made of material more able to absorb crystal defects and prevent defect extension and migration than the hetero-configuration, the dense defect layer preventing defects from extending or migrating into the hetero-configuration; a current diffusion layer, provided between the first electrode and the dense defect layer, the current diffusion layer diffusing current applied through the first electrode; a contact layer, provided between the first electrode and the current diffusion layer, the contact layer making ohmic contact between the first electrode and the current diffusion layer; a semiconductor substrate, provided between the second electrode and the hetero-configuration; a buffer layer, provided on the or substrate, the buffer layer preventing defects from being generated in the semiconductor substrate and the expansion of defects into the active layer; and a reflective layer, provided on the buffer layer, the reflective layer reflecting light emitted by the active layer so that the emitted light does not enter the buffer layer and semiconductor substrate.

The present invention further provides a semiconductor light emitting device including: a hetero-configuration having an active layer that emits light when charge carriers are injected, a first clad layer and a second clad layer, the active layer being interposed between the clad layers, the first and second clad layers keeping the injected charge carriers in the active layer; a first and a second electrode, the hetero-configuration being interposed between the electrodes; a first dense defect layer, provided between the first electrode and the hetero-configuration, the first dense defect layer being made of material more able to absorb crystal defects and prevent defect extension and migration than the hetero-configuration, the first dense defect layer preventing defect from extending or migrating into the hetero-configuration; a current diffusion layer, provided between the first electrode and the first dense defect layer, the current diffusion layer diffusing current applied through the first electrode; a contact layer, provided between the first electrode and the current diffusion layer, the contact layer making ohmic contact between the first electrode and the current diffusion layer; a second dense defect layer, provided between the second electrode and the hetero-configuration, the second dense defect layer made of material being more able to absorb crystal defects and prevent defect extension and migration than the hetero-configuration, the second dense defect layer preventing defects from extending or migrating into the hetero-configuration; and a buffer layer, provided on the second electrode, the buffer layer preventing defects from being generated in the semiconductor substrate and the expansion of defects into the active layer.

DETAILED DESCRIPTION OF THE PREFERRED EMBODIMENTS

Preferred embodiments will be described with reference to the attached drawings.

Figure 1:
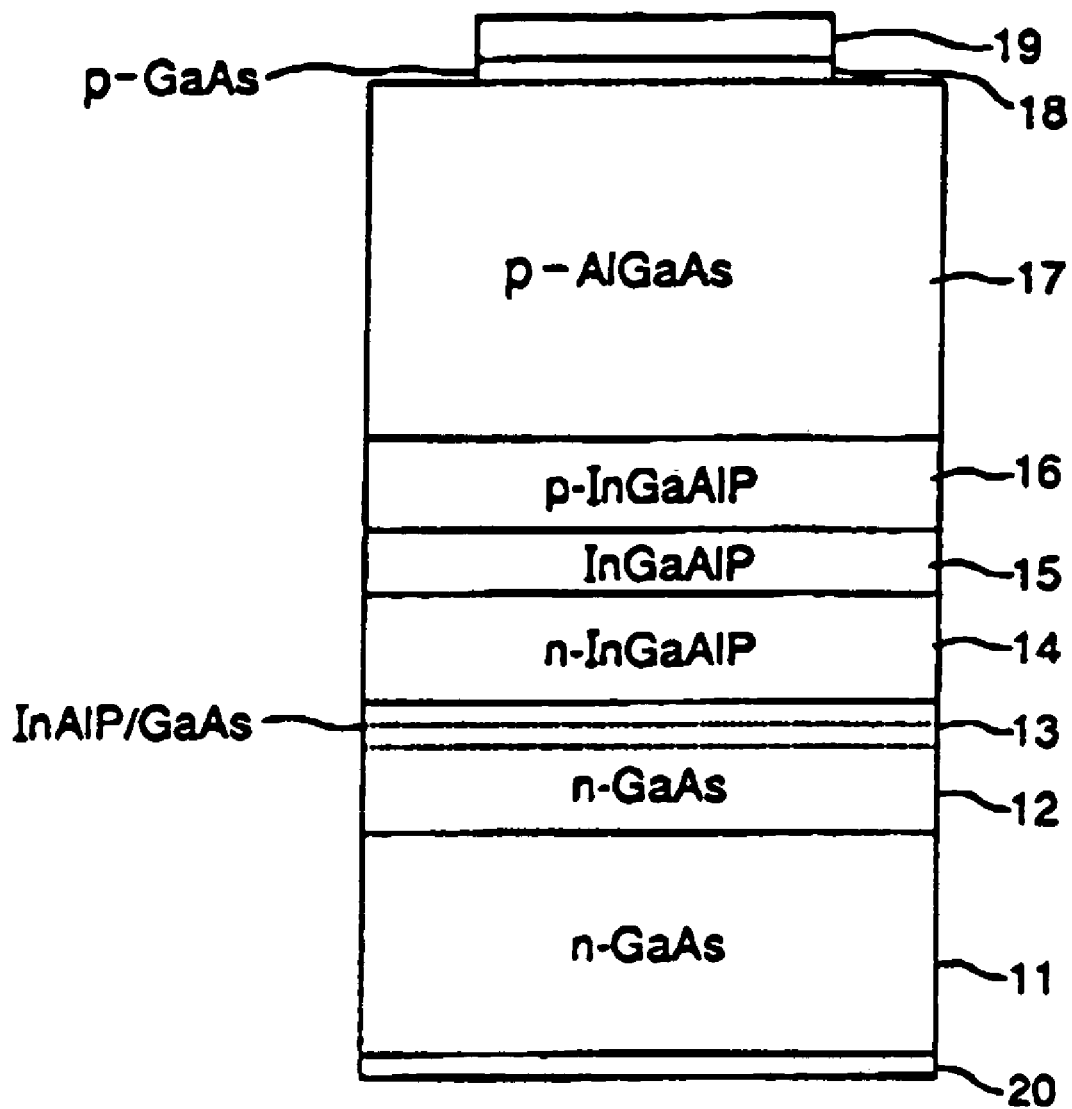
FIG. 1 is a cross sectional schematic illustration of a conventional semiconductor light emitting device.
Figure 2:
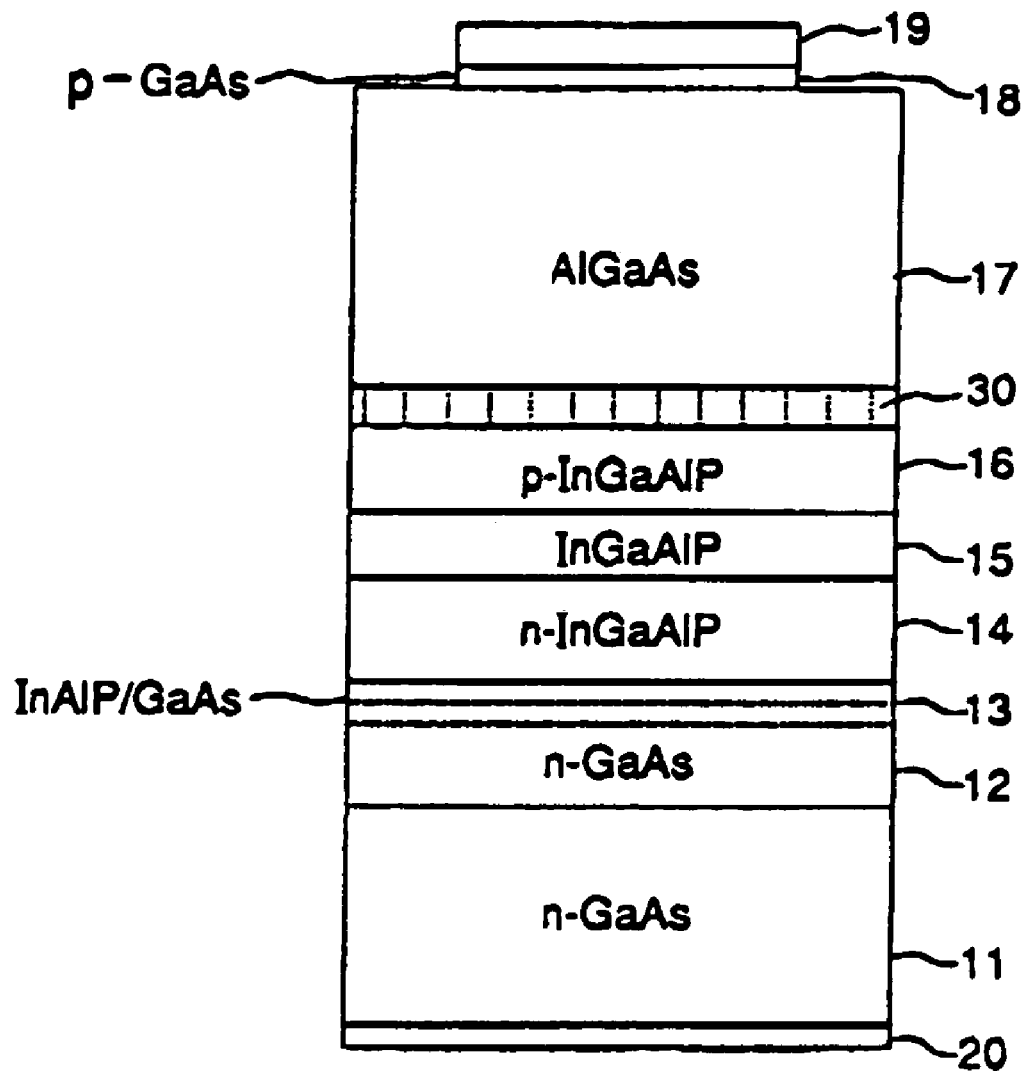
FIG. 2 is a cross sectional schematic illustration of a preferred embodiment of a semiconductor light emitting device according to the present invention.

FIG. 2 shows a cross sectional schematic illustration of an embodiment of the semiconductor light emitting device according to the present invention. The layers of the same reference numerals as the layers shown in FIG. 1 function the same as those conventional device layers.

This semiconductor light emitting device includes: a buffer layer 12 of n-type GaAs; a reflective layer 13 consisting of laminated two layers of indium aluminum phosphate (InAlP)/GaAs (InAlP on GaAs); a lower clad layer 14 of n-type InGaAlP; an active layer 15 of undoped InGaAlP; an upper clad layer 16 of p-type InGaAlP; a dense defect layer 30: a current diffusing layer 17 of p-type AlGaAs; and a contact layer 18 of p-type GaAs These layers are formed in order on a semiconductor substrate 11 of n-type gallium arsenide (GaAs). A double hetero-configuration consists of the lower clad layer 14, the active layer 15 and the upper clad layer 16. An upper electrode 19 is formed the contact layer 18. A lower electrode 20 is formed beneath the substrate 11.

Either of the buffer layer 12 and the current diffusing layer 17 may be omitted. The reflective layer 13 and the contact layer 18 may also be omitted.

Compared to the conventional device of FIG. 1, the added feature of the embodiment of FIG. 2 is the dense defect layer 30 interposed between the p-type InGaAlP upper clad layer 16 and the p-type AlGaAs current diffusing layer 17. The dense defect-injected layer 30 is made of 50 nm-thick InP mixed crystal that is more able to absorb crystal defects and prevent defect extension and migration than the p-type InGaAlP upper clad layer 16.

The semiconductor light emitting device is fabricated as follows:

The layers described above are grown epitaxially one by one on the n-type GaAs substrate 11 formed on a semiconductor wafer as describe below. These epitaxial growths are performed in a chemical vapor deposition (CVD) reaction chamber. A carrier gas (hydrogen) flows into the CVD reaction chamber at a gas flow rate of 10 l/min. The semiconductor substrate 11 is annealed at a temperature in the range of 720° to 870° C.

(1) Trimethylgullium (TMG) and arsenic hydride ($AsH_3$) flow into the chamber at a gas flow rate in the range of 20 to 400 ccm and 500 to 800 ccm, respectively. Further, silicon hydride ($SiH_4$) flows at a gas velocity in the range of 10 to 15 ccm for doping to form the n-type GaAs buffer layer 12 on the substrate 11.

(2) Trimethylgullium and $AsH_3$ flow again at the same gas flow rates in step (1) to form a GaAs layer on the buffer layer 12. Further, trimethylindium (TMI), trimethylaluminum (TMA) and phosphorus hydride ($PH_3$) flow at a gas velocity in the range of 0.5 to 0.8 ccm, 10 to 300 ccm and 250 to 400 ccm, respectively, to form an InAlP layer on the GaAs layer to form the InAlP/GaAs reflective layer 13.

(3) Trimethylindium, TMG, TMA and $PH_3$ flow at the same gas flow rates in the above steps. Further, $SiH_4$ flows at the same gas flow rate in step (1) to form the n-type InGaAlP lower clad layer 14 on the reflective layer 13.

(4) Trimethylgullium, TMG, TAM and $PH_3$ flow at the same gas flow rates in the above steps to form the undoped InGaAlP active layer 15 on the lower clad layer 14.

(5) Trimethylgullium, TMG, TAM and $PH_3$ flow at the same gas flow rates in the above steps. Further, dimethlylzinc (DMZ) flows at a gas velocity in the range of 0.3 to 0.5 ccm for doping to form the p-type InGaAlP upper clad layer 16 on the active layer 15.

(6) The susceptor temperature is decreased by 100° C. Trimethylaluminum and $PH_3$ flow at the same gas flow rates in the above steps to form the dense defect layer 30 of 50 nm-thick InP mixed crystal on the upper clad layer 16.

(7) The chamber temperature decreased by 100° C. in step (6) is increased to the original temperature at which the process is executed in steps (1) to (5). At this temperature, TMA, TMG and $ASH_3$ flow at the same gas flow rates in the above steps. Further, DMZ flows at the same gas flow rate in step (5) for doping to form the p-type AlGaAs current diffusing layer 17 on the dense defect layer 30.

(8) Trimethylgullium and $AsH_3$ flow at the same gas flow rates in the above steps. Further, DMZ flows at the same gas flow rate in step (5) for doping to form the p-type GaAs contact layer 18 on the current diffusing layer 17. And, (9) A reverse sided lapping operation thins the substrate 11. The upper and lower electrodes 19 and 20 are deposited on the contact layer 18 and the thinned substrate 11, respectively. The semiconductor wafer on which the above multiple layers were laminated was diced and molded to obtain many chips of semiconductor light emitting devices (FIG. 2). Each chip was of 400×400 µm² in area and 200 µm in height. Also produced were the chips of the conventional semiconductor light emitting devices (FIGS. 1) of the same size as the present invention.

These semiconductor light emitting devices were tested for luminance efficiency. A forward current of 20 mA of 5 volts was supplied to each device to find out initial luminance efficiency and luminance efficiency after 500 hours have elapsed. These tests were conducted for determining the degradation rate of the semiconductor light emitting devices of the present invention and the conventional devices.

Fifty sample chips were selected per sample lot from the semiconductor light emitting devices of the present invention and also from the conventional devices to determine the initial luminance efficiency and luminance efficiency after 500 hours have elapsed. The dense defect layer 30 of 50 nm-thick InP mixed crystal was grown for the devices of the present invention.

Figure 3:
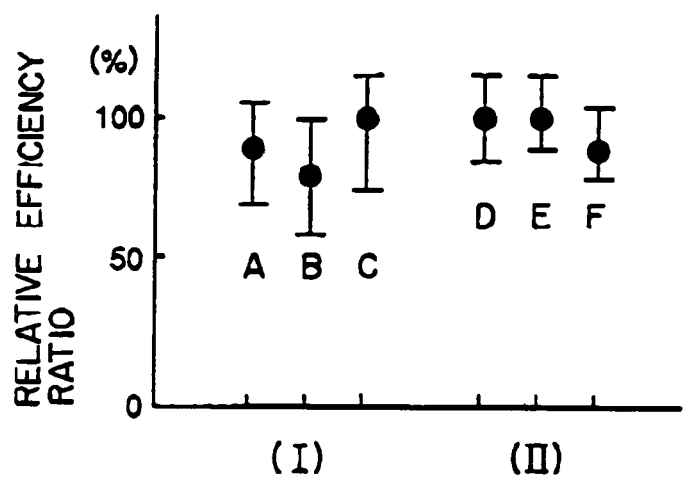
FIG. 3 is a graphical representation of variation of luminance efficiency.

FIG. 3 is a graphical representation of variation of the luminance efficiency after 500 hours have elapsed indicated by the relative efficiency ratio of initial luminance efficiancy/luminance efficiency after 500 hours have elapsed. Each dot depicts an average survival rate for 50 samples per lot (A, B, C, D, E, and F). The upper and lower ends of each bar depict the maximum and minimum survival rates, respectively. FIG. 3 teaches that the sample chips of the present invention (II) have a higher survival rate than the conventional sample chips (I). Further, FIG. 3 teaches that the sample chips of the present invention have nearly the same survival rate for the lots D, E, and F.

The conventional sample chips (lot B) that had the worst survival rates were analyzed by cathode luminescence technique.

Figure 4A:
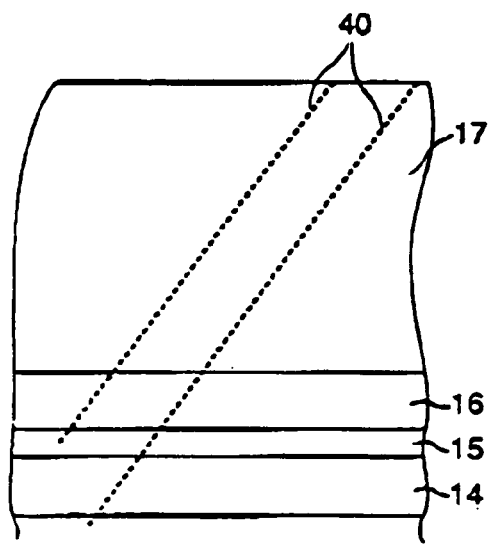
FIGS. 4A and 4B show fragmentary cross sectional views of the conventional sample chip and that of the present invention.

This technique revealed an un-luminous crystallization fault 40 called a dark line as shown in FIG. 4A. F*igure* 4A shows a fragmentary cross sectional view of the conventional sample device chip of FIG. 1. The dark line crossed the current diffusing layer 17 from the device surface. Further, the dark line penetrated into the upper clad layer 16, active layer 15, and lower upper clad layer 14.

The destruction of the active (light emitting) layer 15 by the un-luminous crystallization fault 40 was deemed to cause the low survival rates and corresponding high levels of degradation. The dark line (fault 40) extended towards the active layer 15 from directly below a bonding wire (not shown fixed on the upper electrode 19 of FIG. 1. It is believed that: wire bonding caused damage to the device surface; the damage expanded due to heat and resin stress; and the expanded damage penetrated into the device as the un-luminous crystallization fault 40 that damaged the active layer 15.

Figure 4B:
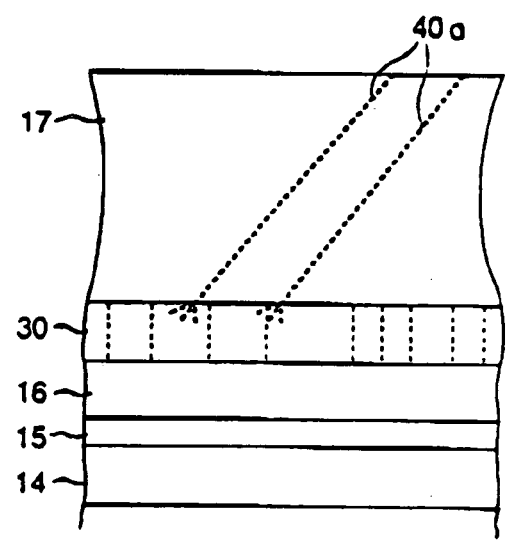

The sample device chips of the present invention were also analyzed by the cathode luminescence technique. This technique revealed an un-luminous crystallization fault 40*a* as shown in FIG. 4B. FIG. 4B shows a fragmentary cross sectional view of the sample device chip of the present invention of FIG. 2. The un-luminous crystallization fault 40*a* produced due to wire bonding crossed the current diffusing layer 17.

However, contrary to the conventional sample device chip of FIG. 4A, the un-luminous crystallization fault 40*a* stopped in the 50 nm-thick dense defect InP layer 30 that is the feature of the present invention. The un-luminous crystallization fault 40*a* did not reach the active layer 15 and upper clad layer 16. The faults 40*a* are absorbed or impeded in the dense defect layer 30 is believed to be the reason for the higher luminance efficiency of the device chips of the present invention. More precisely, the dense defect layer 30 was deemed to prevent the un-luminous crystallization fault 40*a* from extending or migrating into the cladding layer 14 or active layer 15 due to heat and resin stress. The device chips of the present invention were thus protected from defect migration or extension from external areas into the clad and active layers of the device.

FIG. 4B, the fragmentary cross sectional view of FIG. 2, further schematically depicts prevention of secondary generated defects from extending or migrating into the active layer 15 and upper clad layer 16 by the dense defect-injected layer 30.

This advantage was provided by the use of the Inp mixed crystal layer for the dense defect layer 30. Besides Inp mixed crystal, use of Gap, InGaP, InAlP, AlP, and AlAs mixed crystals as the dense defect layer 30 is also contemplated.

However, InGaAs mixed crystal did not work well for the dense defect layer 30. This was noted by observing the boundary of the InGaAs dense defect-injected layer and InGaAlP layers as the active and clad layers with cross section Transmission Electron Microscopy (TEM).

The observation revealed that; enough defects were not provided in the InGaAs layer acting as the dense defect layer 30; the InGaAs layer could not sufficiently disperse the secondary defects traveled or migrated through this layer and due to bonding damage; and a part of the secondary defects were injected into the InGaAlP upper clad layer 16.

The observation further revealed that reduces the effects of a un-luminous crystallization fault 40*a* can only be achieved by providing defects in the dense defect material and not in the InGaAlP layer.

Figure 5:
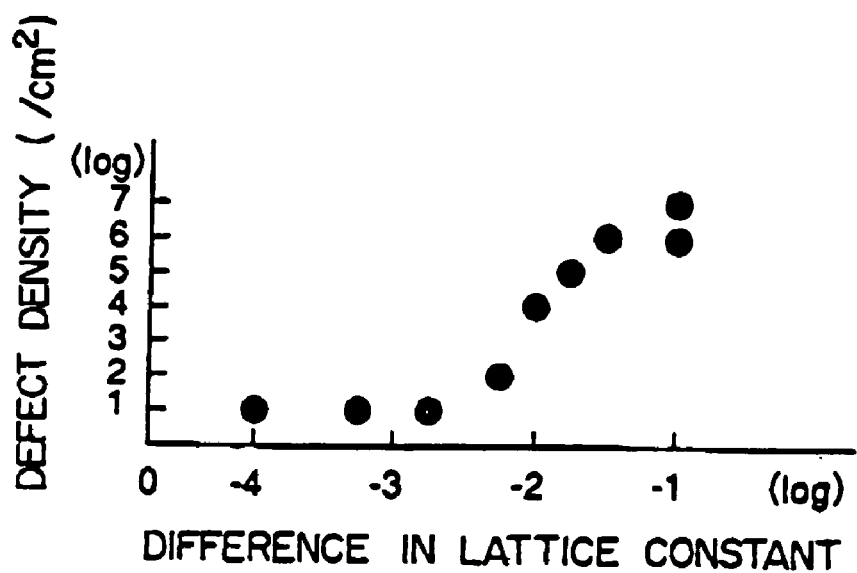
FIG. 5 is a graphical representation of comparison of the device characteristics of the conventional sample chip and that of the present invention.

Moreover, the observation revealed as shown in FIG. 5 that: the desired reduction in defect effects can be achieved when the defect density (the number of defects) of the dense defect layer 30 is $10^4/cm^2$ or more; the difference in lattice constant is $10^{-2}$ or more between the dense defect layer 30 and InGaAlP upper clad layer 16; and the dense defect layer 30 is preferably 10 nm or more in thickness.

Figure 6:
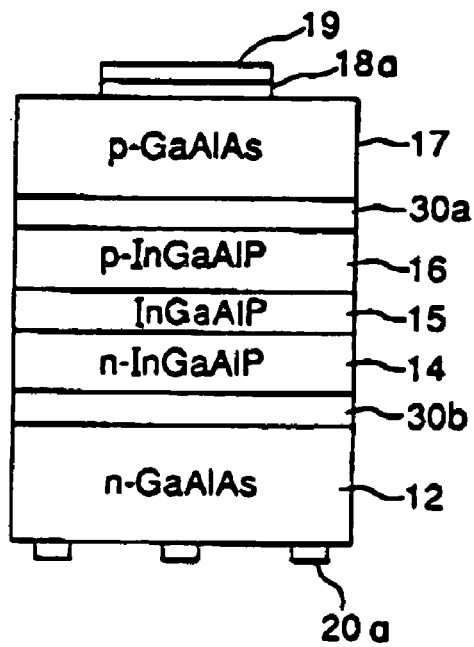
FIG. 6 is a cross sectional schematic illustration of another preferred embodiment of a semiconductor light emitting device according to the present invention.

FIG. 6 shows a cross sectional schematic illustration of another embodiment of the semiconductor light emitting device according to the present invention. The layers of the same reference numerals as the layers shown in FIG. 2 function the same as those conventional device layers. And hence explanation of those are omitted here.

This embodiment does not require the semiconductor substrate 11 of FIG. 2. An upper dense defect layer 30*a* is formed between the transparent current diffusion layer 17 and the upper clad layer 16. Further, a lower dense defect layer 30b is formed between the transparent buffer layer 12 and the lower clad layer 16.

These upper and lower layers 30a and 30b restrict crystal defect damage to the active region of the double hetero-configuration that consists of the n-InGaAlP lower clad layer 14, InGaAlP active layer 15 and p-InGaAlP upper clad layer 16. Further, the layers 30a and 30b restrict crystallization faults being passed into the current diffusion layer 17 and buffer layer 12, respectively. The crystallization faults are generated mostly due to internal stress caused by thermal expansion and shrinkage when the devices are molded. The lower dense defect layer 30b can restrict generation of crystallization faults.

The semiconductor devices of the two embodiments include the double hetero-configuration. This configuration consists of the n-type InGaAlP lower clad layer 14, p-type InGaAlP upper clad layer 16, and undoped InGaAlP active layer 15 interposed between the two clad layers.

According to the preferred embodiments of the invention, semiconductor devices, particularly light emitting devices can be obtained with high reliability, long lifetime, high yield rates and of reasonable price. The light emitting device includes a double or single hetero-configuration that consists of a pair of clad layers and an InGaAlP active layer interposed between the clad layers. During epitaxial growth of this device, a dense defect layer is formed on or beneath the hetero-configuration. Or, two dense defect-injected layers are formed on and beneath the hetero-configuration. The dense defect layer is made of material of two or three mixed crystals. The mixed crystals are a combination of elements selected from the group consisting of In, Ga, Al, P, and As. The elements for the combination are different in lattice constant of $10^{-2}$ or more. Further, the dense defect-injected layer includes defects of $10^4/cm^2$ or more. Such a dense defect layer prevents secondarily generated defects from migrating or extending as un-luminance crystallization faults into the important InGaAlP active (light emitting) layer.

As described above, the present invention provides a semiconductor device configuration including at least a first layer with a first function, a second layer with a second function, and a third layer interposed between the first and second layers. The third layer is a dense defect layer made of material that is more able to absorb crystal defects and prevent defect migration and extension than the second layer. The third layer disperses or absorbs a dark line (the un-luminous crystallization fault in the embodiments) that would otherwise cross the first layer and reach the second layer. The third layer thus restricts the extension or migration of crystallization faults. The present invention is therefore useful for any semiconductor devices with a layer of specific function that should be protected from crystallization faults.

What is claimed is:

1. A semiconductor light emitting device comprising:
   a substrate;
   a first clad layer of a first conductive type formed over the substrate;
   an active layer directly formed on said first clad layer;
   a second clad layer of a second conductive type directly formed on said active layer;
   a defect layer directly formed on said second clad layer;
   a current diffusion layer of the second conductive type formed on said defect layer;
   a first electrode electrically connected to said first clad layer; and
   a second electrode electrically connected to said current diffusion layer.

2. The semiconductor light emitting device according to claim 1, wherein the defect layer is of higher defect density than at least the second clad layer.

3. The semiconductor light emitting device according to claim 1, wherein a material of said defect layer is $10^{-2}$ or more different in lattice constant from materials of said first clad layer, said active layer and said second clad layer.

4. The semiconductor light emitting device according to claim 1, wherein a material of said defect layer is two or three mixed crystal selected from a group of consisting of In, Ga, Al, P, and As.

5. The semiconductor light emitting device according to claim 1, wherein said defect layer is 10 nm or more in thickness.

6. A semiconductor light emitting device comprising:
   a substrate;
   a first clad layer of a first conductive type formed over the substrate;
   an active layer directly formed on said first clad layer;
   a second clad layer of a second conductive type directly formed on said active layer;
   a layer having a defect region, said defect region being directly formed on said second clad layer;
   a first electrode electrically connected to said first clad layer; and
   a second electrode electrically connected to said current diffusion layer having the defect region.

7. The semiconductor light emitting device according to claim 6, wherein the defect layer is of higher defect density than at least the second clad layer.

8. The semiconductor light emitting device according to claim 6, wherein a material of said defect layer is $10^{-2}$ or more different in lattice constant from materials of said first clad layer, said active layer and said second clad layer.

9. The semiconductor light emitting device according to claim 6, wherein a material of said defect layer is two or three mixed crystal selected from a group of consisting of In, Ga, Al, P, and As.

10. The semiconductor light emitting device according to claim 6, wherein said defect layer is 10 nm or more in thickness.

* * * * *

UNITED STATES PATENT AND TRADEMARK OFFICE
CERTIFICATE OF CORRECTION

PATENT NO. : 7,038,243 B1 Page 1 of 1
APPLICATION NO. : 08/578980
DATED : May 2, 2006
INVENTOR(S) : Kamakura It is certified that error appears in the above-identified patent and that said Letters Patent is hereby corrected as shown below:

On the title page, Item (73), the Assignee is incorrect. Item (73) should read:
-- (73) Assignee: Kabushiki Kaisha Toshiba, Kawasaki (JP)--

Signed and Sealed this

First Day of August, 2006

JON W. DUDAS
*Director of the United States Patent and Trademark Office*